United States Patent [19]
Wang

[11] Patent Number: 5,860,195
[45] Date of Patent: Jan. 19, 1999

[54] LOCKING DEVICE FOR LOCKING HEAT DISSIPATERS MOUNTED ON COMPUTER CIRCUIT BOARDS

[75] Inventor: Michael Wang, Taipei, Taiwan

[73] Assignee: Tenn Max Inc., Taipei, Taiwan

[21] Appl. No.: 859,838

[22] Filed: May 19, 1997

[30] Foreign Application Priority Data

Oct. 18, 1996 [TW] Taiwan ................................. 85216050

[51] Int. Cl.$^6$ ....................................................... F28F 7/00
[52] U.S. Cl. ............................ 24/459; 24/518; 165/80.3; 361/704
[58] Field of Search .............................. 24/459, 457, 524, 24/518, 517; 361/704, 717, 718, 719, 722, 709, 710; 165/80.3, 185; 174/16.3; 257/718, 719

[56] References Cited

U.S. PATENT DOCUMENTS

| | | | |
|---|---|---|---|
| 5,448,449 | 9/1995 | Bright et al. | 361/704 |
| 5,542,468 | 8/1996 | Lin | 361/704 X |
| 5,600,540 | 2/1997 | Blomquist | 361/704 |
| 5,638,258 | 6/1997 | Lin | 361/704 |
| 5,660,562 | 8/1997 | Lin | 361/704 X |
| 5,684,676 | 11/1997 | Lin | 361/704 |

FOREIGN PATENT DOCUMENTS 270562  6/1984  Taiwan .

*Primary Examiner*—James R. Brittain
*Attorney, Agent, or Firm*—Bacon & Thomas, PLLC

[57] ABSTRACT

A locking device for locking a heat-dissipating member securely in position on the housing of a CPU is provided. The locking device includes a flexible securing piece which is an integral piece including an elongated flexible middle portion having one end formed into a first fastening portion and the other end formed into a coupling portion. The first fastening portion is formed with a first fastening hole, and the coupling portion is formed with an angled portion and a slot extending from the angled portion to near the hook-shaped portion. Further, the locking device includes a pressable fastening piece which includes a second fastening portion having a second fastening hole; a pair of hook-shaped pieces linked to the second fastening portion; a stopper linked to the hook-shaped pieces; and a press portion linked to the second fastening portion; wherein the hook-shaped pieces and the stopper are coupled to the slot in the coupling portion of the flexible securing piece. An elastic member has a first end connected to the flexible securing piece and a second end connected to the pressable fastening piece. The locking device can be easily and effortlessly mounted on a CPU mount for locking a heat-dissipating member on the CPU mount. It is also adjustable in length so that it can be mounted on CPU mounts of various dimensions for locking a heat-dissipating member on the CPU mount.

13 Claims, 5 Drawing Sheets

5,860,195

LOCKING DEVICE FOR LOCKING HEAT DISSIPATERS MOUNTED ON COMPUTER CIRCUIT BOARDS

BACKGROUND OF THE INVENTION

1. Field of the Invention

This invention relates in general to locking means, and more particularly, to a locking device for locking a heat-dissipating member securely in position on a computer circuit board, such as on the CPU (central processing unit) mount on a computer circuit board used to mount the package of a CPU device.

2. Description of Related Art

Computer chips, such as CPU chips will produce heat during operation when electric current flows therethrough. If not dissipated, the heat will accumulate and then cause damage to the circuitry of the chips. Therefore, the CPU adapter on a computer circuit board is customarily mounted with a heat-dissipating member that can dissipate heat away from the CPU. One conventional heat-dissipating member is illustrated in FIG. 1, which is formed with a plurality of fin-like pieces for increasing heat-dissipating surface.

Conventionally, a heat-dissipating member is mounted and secured on a CPU mount by using a plastic frame which is formed with a plurality of hook pins for fastening the heat-dissipating member tightly on the CPU mount. One drawback to this structure, however, is that the plastic frame is difficult, and thus involves laborious effort, to mount and dismount. The plastic frame is an insulator that contributes nothing to the heat-dissipating efficiency. Further, the heat produced by the CPU may degrade the mechanical properties of the plastic frame, causing the plastic frame not able to secure the heat-dissipating member tightly in position on the CPU.

One improvement on the locking means for securing a heat-dissipating member on a CPU mount is disclosed in ROC Utility Model No. 270562. The locking device of this patent can be used on ZIF CPU mount. It includes a metal presser and a metal locking plate that allows for easy mounting and high heat-dissipating efficiency. One drawback to this patent however, is that the mounting and dismounting of the device require the use of two hands or hand tools to carry out. This drawback makes the patent difficult to use in practice. Some users may even get hurt when mounting or dismounting the locking device of this patent.

There exists, therefore, a need for a new locking device which can be mounted or dismounted effortlessly and safely. This new locking device should also be easy and quick to mount so that production time can be reduced for increased competitiveness on the market. Moreover, this new locking device should be adjustable in length so that it can be used to lock heat-dissipating members of various dimensions.

SUMMARY OF THE INVENTION

It is therefore a primary objective of the present invention to provide a locking device for locking a heat-dissipating member on a CPU mount which can be easily and effortlessly mounted on the CPU mount without the use of two hands to perform.

It is another objective of the present invention to provide a locking device which allows the user to safely mount it on a CPU mount for locking a heat-dissipating member on the CPU mount.

It is still another objective of the present invention to provide a locking device which is adjustable in length so that it can be mounted on CPU mounts of various dimensions for locking a heat-dissipating member on the CPU mount.

In accordance with the foregoing and other objectives of the present invention, a new locking device for locking a heat-dissipating member on a CPU mount is provided.

The locking device of the invention includes three separate parts: a flexible securing piece, a pressable fastening piece, and an elastic member such as a spiral spring or an elastic strip. The elastic member is formed with a first end and a second end. The flexible securing piece is an integral piece with an elongated middle portion having one end formed into a first fastening portion and the other end formed into a coupling portion. The first fastening portion is a bent portion of the flexible securing piece formed with a first fastening hole for locking with a pin formed on the CPU mount. The coupling portion is formed with a hook-shaped portion which can be hooked to the first end of the elastic member. Instead of the hook-shaped portion, the coupling portion can be also formed with a round hole for hook-connection with the first hook-shaped end of the elastic member. Further, the coupling portion is formed with an angled portion and a slot extending from the angled portion to near the hook-shaped portion.

The pressable fastening piece includes a main body which is formed with a second fastening portion, a press portion, a pair of hook-shaped pieces, and a stopper. The hook-shaped pieces and stopper can be integrally formed with the second fastening portion by punching, or can be first formed separately and then affixed to the pressable fastening piece by soldering. The second fastening portion is formed with a second fastening hole for locking with a pin formed on the CPU mount. The first fastening portion of the flexible securing piece and the second fastening portion of the pressable fastening piece are used in conjunction to fasten the heat-dissipating member securely on the CPU mount. Further, the hook-shaped pieces and stopper are formed in position above the second hole of the second fastening portion of the pressable fastening piece.

The hook-shaped pieces are each a substantially L-shaped piece including an angled end and a base portion. The angled end can be engaged with the slot in the coupling portion of the flexible securing piece so as to couple the pressable fastening piece to the flexible securing piece. The stopper is also a substantially T-shaped piece including a head portion and a base portion connected in perpendicular to the head portion. The head portion is formed with a hooking hole near the joint between the head portion and the base portion. The hooking hole allows the second end of the elastic member to be hooked thereto. Instead of the hooking hole, the head portion can be also formed with a hooking portion for hook-connection with the second end of the elastic member. When the pressable fastening piece is coupled to the flexible securing piece, the stopper is positioned above the hook-shaped pieces. The hooking hole in the stopper allows the elastic member to be connected to the stopper by hooking the second end to the hole.

To assemble the locking device, the hook-shaped pieces and the stopper on the pressable fastening piece are engaged with the slot in the coupling portion of the flexible securing piece so as to couple the pressable fastening piece to the flexible securing piece. Then, the first end of the elastic member is hooked to the hook-shaped portion on the flexible securing piece, while the second end of the same is hooked to the hooking hole in the stopper. In the assembled locking device, the base portion of the stopper and the base portion of the hook-shaped pieces are tightly secured in the slot in the coupling portion by means of the elasticity of the elastic member.

When the locking device is used to lock a heat-dissipating member on a CPU mount, the first fastening hole in the first fastening portion of the flexible securing piece is hooked to the pin on one side of the CPU mount. The user can then press his/her finger on the press portion so as to move the pressable fastening piece in a pivotal manner using the base portion of the hook-shaped pieces of the flexible securing piece as a pivot, thereby hooking the second fastening hole in the second fastening portion to the pin on the other side of the CPU mount. The stopper can prevent the second fastening portion from overshooting since when the pressable fastening piece is pivotally tamed, the stopper will be stopped by the coupling portion of the flexible securing piece. This allows the second fastening hole to be effortlessly hooked to the pin on the other side of the CPU mount by a single finger of the user. After the second fastening hole is hooked to the pin and the user's finger moves away from the press portion, the elasticity from the stretched elastic member allows the pressable fastening piece to be securely fastened to the pin, thereby locking the heat-dissipating member tightly on the CPU mount.

When dismounting the locking device off the CPU mount, the user can press down on the coupling portion of the flexible securing piece to cause the second fastening hole to be flipped away from the pin by means of the flexibility of the flexible securing piece. After this, the elastic member is restored to a non-stretched state. Since the base portion of the stopper and the base portion of the hook-shaped pieces are engaged with the slot, the user can easily and effortlessly dismount without the use of both hands the locking device from the CPU mount.

Since the angled end of the hook-shaped pieces and the head portion of the stopper are extended to a length from the second fastening portion of the pressable fastening piece, an adjustable space is formed between the coupling portion of the flexible securing piece and the second fastening portion of the pressable fastening piece of the locking device, that allows the adjustment of the locking device to various CPU mounts.

The foregoing preferred embodiment of the invention discloses a locking device which is used specifically to lock a heat-dissipating member on a CPU mount. However, the application of the invention is not limited to his. The locking device of the invention, broadly speaking, can be used to lock various other devices on a mount.

BRIEF DESCRIPTION OF DRAWINGS

The invention can be more fully understood by reading the following detailed description of the preferred embodiments, wit reference made to the accompanying drawings, wherein.

DETAILED DESCRIPTION OF PREFERRED EMBODIMENT

Figure 1:
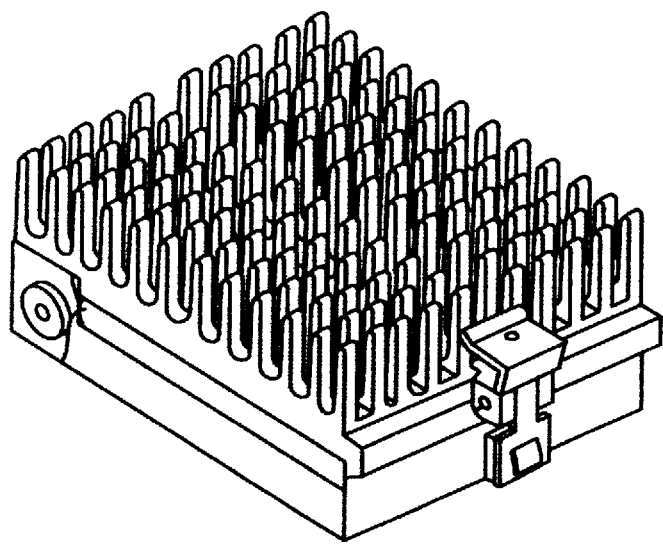
FIG. 1 is a perspective view of a conventional locking device locking a heat-dissipating member in position on a CPU mount.
Figure 2:
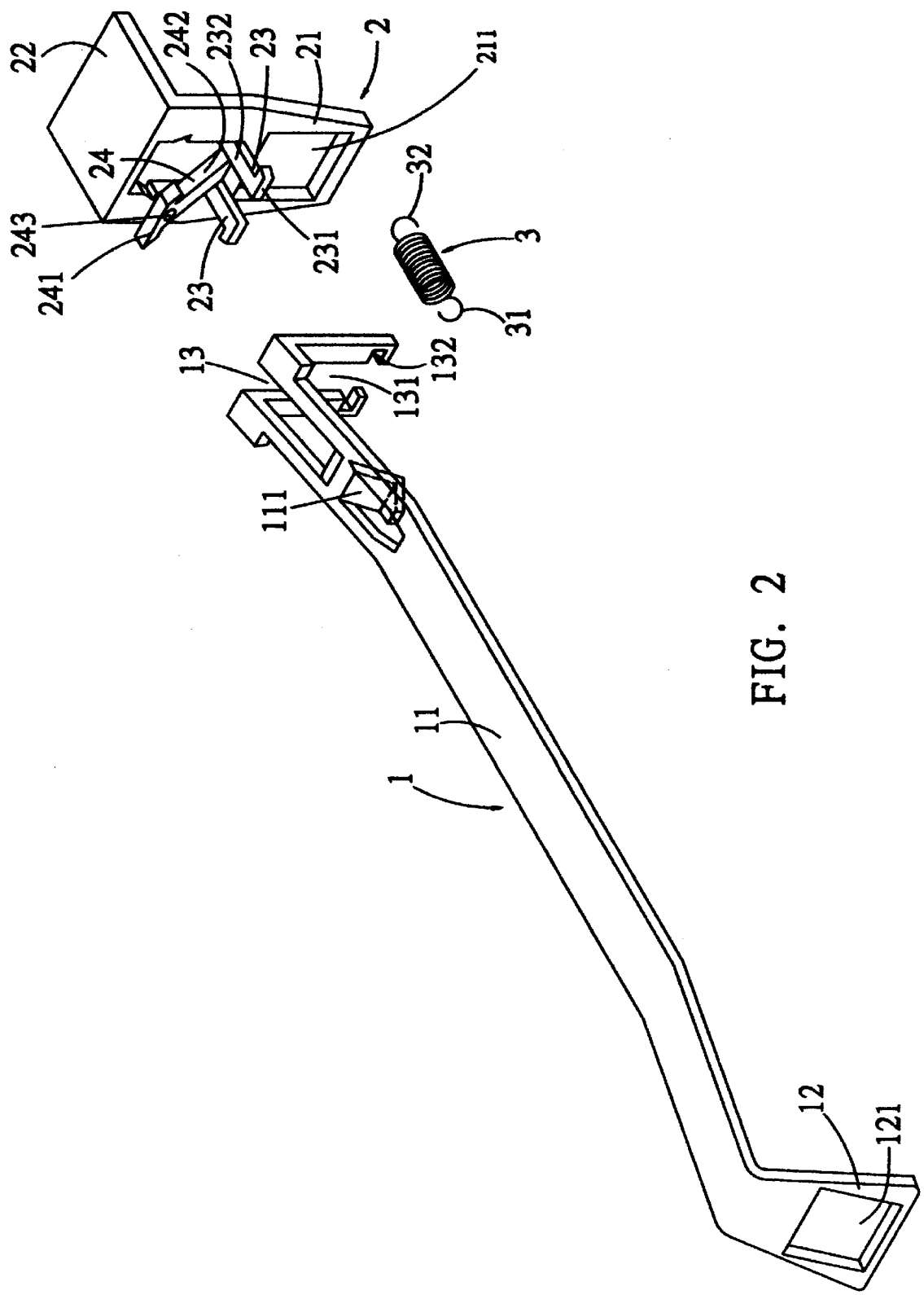
FIG. 2 is an exploded perspective view of the locking device of the invention.

As shown in FIG. 2, the locking device of the invention includes three separate parts: a flexible securing piece 1, a pressable fastening piece 2, and an elastic member 3 such as a spiral spring or an elastic strip. The elastic member 3 is formed with a first hook-shaped end 31 and a second hook-shaped end 32. The flexible securing piece 1 is an integral piece with an elongated middle portion 11 having one end formed into a first fastening portion 12 and the other end formed into a coupling portion 13. The first fastening portion 12 is a bent portion of the flexible securing piece 1 formed with a first fastening hole 121 for locking with a pin 51 formed on the CPU mount 5 (shown in FIGS. 4 and 5). The coupling portion 13 is formed with a hook-shaped portion 111 which can be hooked to the first hook-shaped end 31 of the elastic member 3. Further, the coupling portion 13 is formed with an angled portion 132 and a slot 131 extending from the angled portion 132 to near the hook-shaped portion 111.

The pressable fastening piece 2 includes a second fastening portion 21, a press portion 22, a pair of hook-shaped pieces 23, and a stopper 24. The hook-shaped pieces 23 and stopper 24 can be integrally formed with the second fastening portion 21 by punching, or can be first formed separately and then affixed to the second fastening portion 21 by soldering. The second fastening portion 21 is formed with a second fastening hole 211 for locking with a pin 52 formed on the CPU mount 5 (shown in FIGS. 4 and 5). The first fastening portion 12 of the flexible securing piece 1 and the second fastening portion 21 of the pressable fastening piece 2 are used in conjunction to fasten the heat-dissipating member 6 securely on the CPU mount 5 (shown in FIGS. 4 and 5). Further, the pair of hook-shaped pieces 23 and a stopper 24 are formed in position above the second fastening hole 211 of the second fastening portion 21.

The hook-shaped pieces 23 are each a substantially L-shaped piece including an angled end 231 and a base portion 232. The angled end 231 can be engaged with the slot 131 in the coupling portion 13 of the flexible securing piece 1 so as to couple the pressable fastening piece 2 to die flexible securing piece 1. The stopper 24 is a substantially T-shaped piece including a head portion 241 and a base portion 242 connected in perpendicular to the head portion 241. The head portion 241 is further formed with a hooking hole 243 near the joint between the head portion 241 and the base portion 242. The hooking hole 243 allows the second hook-like end 32 of the elastic member 3 to be hooked thereto. When the pressable fastening piece 2 is coupled to the flexible securing piece 1, the stopper 24 is positioned above the hook-shaped pieces 23. The hole 243 in the stopper 24 allows the elastic member 3 to be connected to the stopper 24 by hooking the second hook-shaped end 32 to the hole 243.

Figure 3:
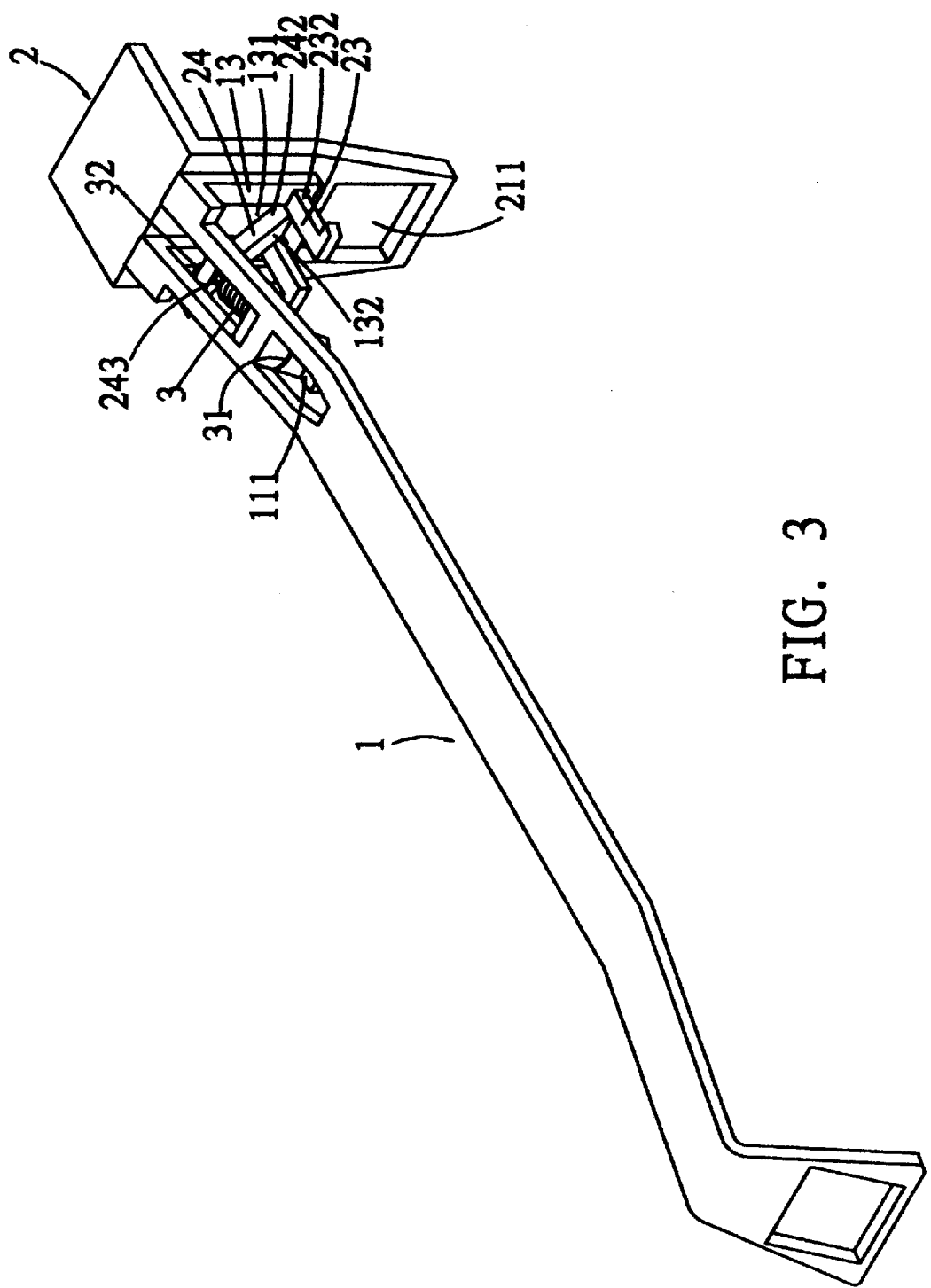
FIG. 3 is a perspective view of the locking device of the invention when assembled.

FIG. 3 is a perspective view of the locking device of FIG. 2 when assembled. To assemble the locking device, the hook-shaped pieces 23 and the stopper 24 on the pressable fastening piece 2 are engaged with the slot 131 in the coupling portion 13 of the flexible securing piece 1 so as to couple the pressable fastening piece 2 to the flexible securing piece 1. Then, the first hook-shaped end 31 of the elastic member 3 is hooked to the hook-shaped portion 111 on the flexible securing piece 1, while the second hook-shaped end 32 of the same is hooked to the hooking hole 243 in the stopper 24. In the assembled locking device 4, the base portion 242 of the stopper 24 and the base portion 232 of the hook-shaped pieces 23 are tightly secured in the slot 131 in the coupling portion 13 by means of the elasticity of the elastic member 3.

Figure 4:
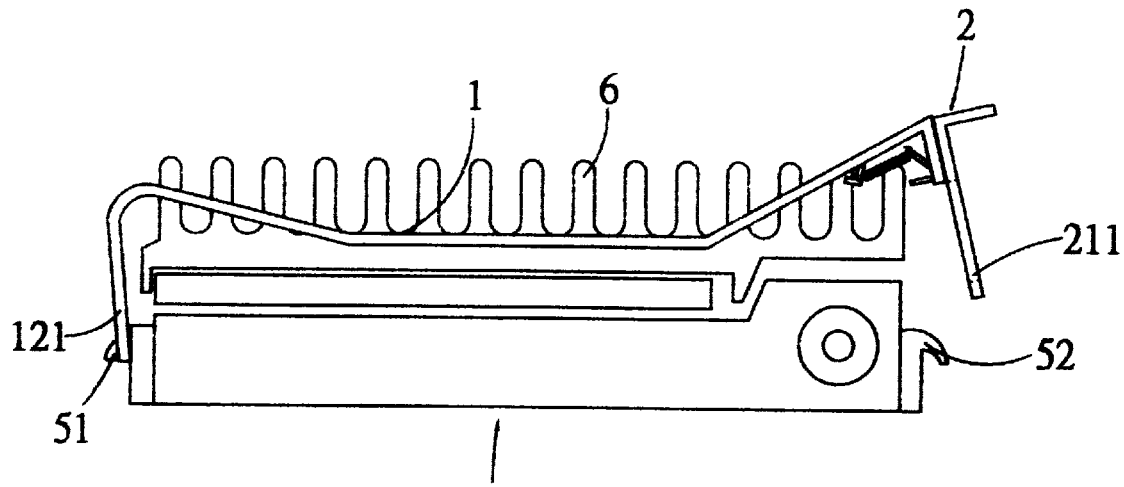
FIG. 4 is a schematic sectional diagram used to depict how the locking device of the invention is used to lock a heat-dissipating member in position on the IC package of a CPU.
Figure 5:
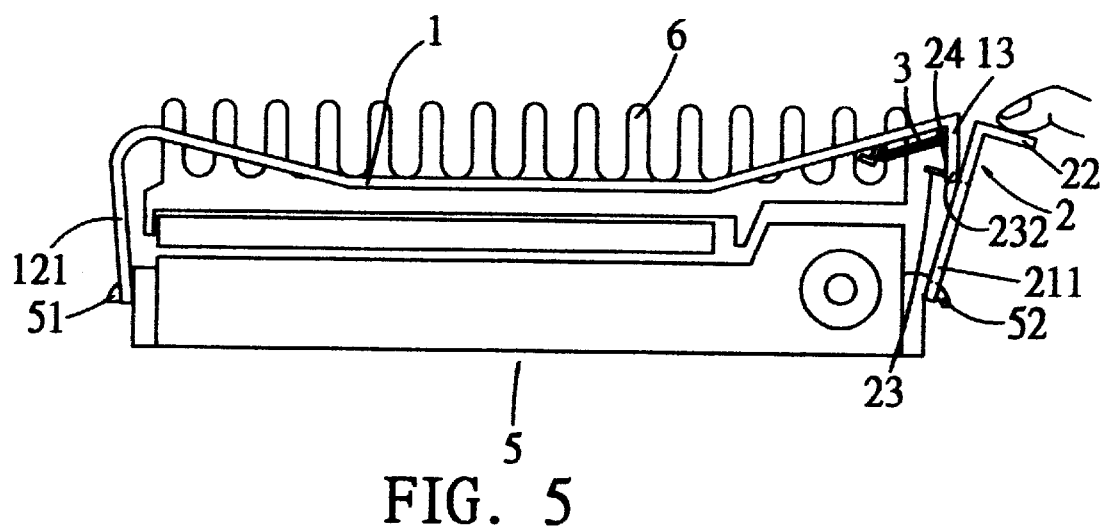
FIG. 5 is a schematic sectional diagram used to depict how the locking device of the invention is mounted.

As shown in FIG. 4, when the locking device 4 is used to lock a heat-dissipating member 6 on a CPU mount 5, the first fastening hole 121 in the first fastening portion 12 of the flexible securing piece 1 is hooked to the pin 51 on one side of the CPU mount 5; then as shown in FIG. 5, the user can press his/her finger on the press portion 22 so as to move the pressable fastening piece 2 in a pivotal manner using the free end of the coupling portion 13 of the flexible securing piece 1 as a pivot thereby hooking the second fastening hole 211 in the second fastening portion 21 to the pin 52 on the other side of the CPU mount 5. The stopper 24 can prevent the second fastening portion 21 from overshooting since when the pressable fastening piece 2 is pivotally turned, the stopper 24 will be stopped by the coupling portion 13. This allows the second fastening hole 211 to be effortlessly hooked to the pin 52 on the other side of the CPU mount 5 by a single finger of the user. After the second fastening hole 211 is hooked to the pin 52 and the user's finger moves away from the press portion 22, the elasticity from the stretched elastic member 3 allows the pressable fastening piece 2 to be securely fastened to the pin 52, thereby locking the heat-dissipating member 6 lightly on the CPU mount 5.

Figure 6:
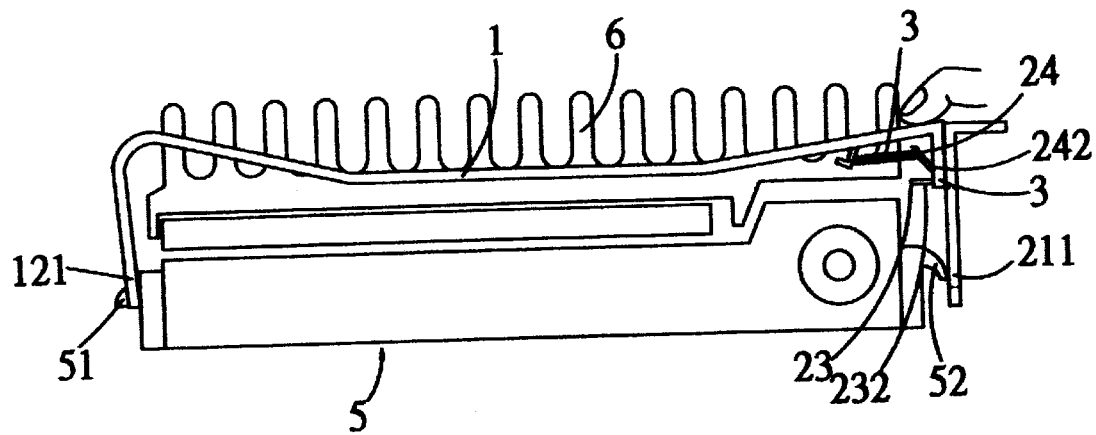
FIG. 6 is a schematic sectional diagram used to depict how the locking device of the invention can be dismounted.

Referring further to FIG. 6, when dismounting the locking device off the CPU mount 5, the user can press down on the coupling portion 13 of the flexible securing piece 1 to cause the second fastening hole 211 to be flipped away from the pin 52 by means of the flexibility of the flexible securing piece 1. Then, releasing the pressure on the coupling portion 13, the flexible securing piece 1 will recover to its non-pressed state by means of the restoring force thereof such that the second fastening portion 21 will be disengaged with the pin 52. Since the base portion 242 of the stopper 24 and the base portion 232 of the hook-shaped pieces 23 are engaged with the slot 131, the user can easily and effortlessly dismount the locking device 4 from the CPU mount 5.

Figure 7:
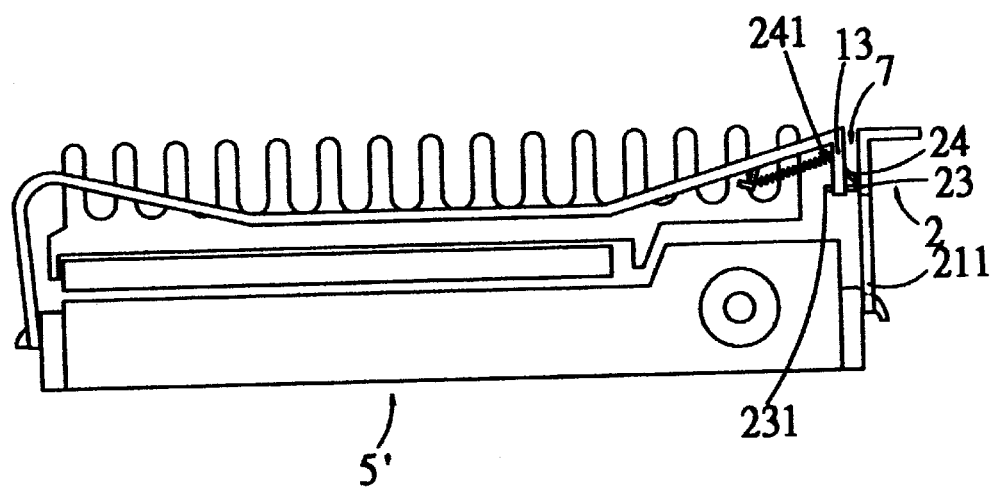
FIG. 7 is a schematic sectional diagram used to depict how the locking device of the invention is used to lock the IC package of a CPU with a different length.

Referring to FIG. 7, since the angled end 231 of the hook-shaped pieces 23 and the head portion 241 of the stopper 24 are extended to a length on the second fastening portion 21 of the pressable fastening piece 2, an adjustable space 7 is formed between the coupling portion 13 of the flexible securing piece 1 and the second fastening portion 21 of the pressable fastening piece 2, that allows the adjustment of the locking device to various sizes so that it can be mounted on CPU mounts of different dimensions.

The foregoing preferred embodiment of the invention discloses a locking device which is used specifically to lock a heat-dissipating member on a CPU mount without the use of both hands. However, the application of the invention is not limited to this. The locking device of the invention, broadly speaking, can be used to lock various other devices on a mount.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A locking device for locking a heat-dissipating member securely in position on a computer circuit board, comprising:

a flexible securing piece including an elongated flexible middle portion having one end formed into a first fastening portion and the other end formed into a coupling portion, said first fastening portion being formed with a first fastening hole and said coupling portion being formed with an angled portion, a hook-shaped portion, and a slot extending from the angled portion to near said hook-shaped portion;

a pressable fastening piece which includes a second fastening portion having a second fastening hole; a pair of hook-shaped pieces linked to said second fastening portion; a stopper linked to said hook-shaped pieces; and a press portion linked to said second fastening portion; wherein said hook-shaped pieces and said stopper are coupled to said slot in said coupling portion of said flexible securing piece; and at least an elastic member having a first end connected to said flexible securing piece and a second end connected to said pressable fastening piece.

2. The locking device of claim 1, wherein said hook-shaped pieces and said stopper are integrally formed with said second fastening portion.

3. The locking device of claim 2, wherein said hook-shaped pieces and said stopper are formed from said second fastening portion by press molding.

4. The locking device of claim 1, wherein said hook-shaped pieces and said stopper are affixed to said second fastening portion by soldering.

5. The locking device of claim 1, wherein said flexible securing piece is formed with a hook-shaped portion for hook-connection with the first end of said elastic member.

6. The locking device of claim 1, wherein the second end of said elastic member is connected to said stopper of said pressable fastening piece.

7. The locking device of claim 6, wherein said stopper is formed with a hooking hole for hook-connection with the second end of said elastic member.

8. The locking device of claim 6, wherein said stopper is formed with a head portion for hook-connection with the second end of said elastic member.

9. The locking device of claim 1, wherein said flexible securing piece is formed with a hook-shaped portion for hook-connection with the first end of said elastic member.

10. The locking device of claim 1, wherein said elastic member is a spiral spring.

11. The locking device of claim 1, wherein said hook-shaped pieces on said pressable fastening piece are each substantially L-shaped in form.

12. The locking device of claim 1, wherein said stopper is substantially T-shaped in form.

13. The locking device of claim 1, wherein the CPU mount is formed with a first pin and a second pin on both sides, said first pin being hooked to the first fastening hole in said first fastening portion of said flexible securing piece and said second pin being hooked to the second fastening hole in said second fastening portion of said pressable fastening piece.

* * * * *